United States Patent
Min

(10) Patent No.: US 6,813,723 B1
(45) Date of Patent: Nov. 2, 2004

(54) METHOD OF COMPENSATING FOR DELAY BETWEEN CLOCK SIGNALS

(75) Inventor: Jun Kyu Min, Kyonggi-do (KR)

(73) Assignee: Hyundai Electronics Industries Co., Ltd., Ichon (JP)

( * ) Notice: Subject to any disclaimer, the term of this patent is extended or adjusted under 35 U.S.C. 154(b) by 608 days.

(21) Appl. No.: 09/698,223

(22) Filed: Oct. 30, 2000

(30) Foreign Application Priority Data

Nov. 9, 1999 (KR) .......................................... 1999/49556

(51) Int. Cl.[7] .............................................. H04L 5/00
(52) U.S. Cl. .................... 713/401; 713/400; 713/401; 713/500; 713/501; 713/502; 713/503; 713/600; 713/601; 716/5; 716/6; 716/8
(58) Field of Search ................................. 713/400, 401, 713/500–503, 600–601; 716/5, 6, 8

(56) References Cited

U.S. PATENT DOCUMENTS

| | | | | |
|---|---|---|---|---|
| 5,122,679 A | * | 6/1992 | Ishii et al. ................... 327/147 |
| 5,175,447 A | * | 12/1992 | Kawasaki et al. ........... 327/211 |
| 5,204,559 A | * | 4/1993 | Deyhimy et al. ............ 327/232 |
| 5,206,861 A | * | 4/1993 | Hannon et al. .............. 714/731 |
| 5,210,700 A | * | 5/1993 | Tom ............................... 716/6 |
| 5,235,566 A | * | 8/1993 | Merrill ........................ 368/113 |
| 5,272,390 A | * | 12/1993 | Watson et al. ............... 327/141 |
| 5,408,640 A | | 4/1995 | MacIntyre et al. .......... 395/550 |
| 5,467,040 A | * | 11/1995 | Nelson et al. ............... 327/276 |
| 5,477,178 A | * | 12/1995 | Maki ........................... 327/161 |
| 5,606,567 A | * | 2/1997 | Agrawal et al. ............. 714/732 |
| 5,608,645 A | * | 3/1997 | Spyrou ........................... 716/6 |
| 5,764,528 A | * | 6/1998 | Nakamura ...................... 716/6 |
| 5,774,371 A | * | 6/1998 | Kawakami .................... 716/10 |
| 5,920,830 A | * | 7/1999 | Hatfield et al. ............. 702/119 |
| 6,073,260 A | * | 6/2000 | Kurita ......................... 714/724 |
| 6,088,821 A | * | 7/2000 | Moriguchi et al. ......... 714/724 |
| 6,226,778 B1 | * | 5/2001 | Konno et al. ................. 716/10 |
| 6,305,003 B1 | * | 10/2001 | McBride ....................... 716/12 |
| 6,388,480 B1 | * | 5/2002 | Stubbs et al. ............... 327/156 |
| 6,405,336 B1 | * | 6/2002 | Ohashi ......................... 714/738 |
| 6,529,571 B1 | * | 3/2003 | Gaudet ........................ 375/363 |

FOREIGN PATENT DOCUMENTS

JP 402285708 A * 11/1996 .......... H03K/3/037

* cited by examiner

*Primary Examiner*—Lynne H. Browne
*Assistant Examiner*—Nitin Patel
(74) *Attorney, Agent, or Firm*—Fleshner & Kim, LLP

(57) ABSTRACT

Method of compensating for a delay between clock signals for a semiconductor integrated circuit having a plurality of devices synchronous to a plurality of clock signals, including the steps of (1) searching for devices between which a data transmission path is set up synchronous to different clock signals among the plurality of devices, and (2) adding a plurality of delays only to between the devices having the data transmission path set up therebetween for compensating for the delay coming from a difference of clock signals, whereby solving non-uniformity of clock signals by using a small number of delays.

9 Claims, 3 Drawing Sheets

METHOD OF COMPENSATING FOR DELAY BETWEEN CLOCK SIGNALS

BACKGROUND OF THE INVENTION

1. Field of the Invention

The present invention relates to a method for designing an integrated circuit, and more particularly, to a method of compensating for a delay between clock signals suitable for preventing improper data transmission caused by delay between clocks used in an integrated circuit.

2. Background of the Related Art

In general, the integrated circuit employs multi-clock system in which different clock signals are used. Of the various problems caused by use of the different clock signals, the improper data transmission is one of the problem.

A related art method of compensating for a delay between clock signals will be explained with reference to the attached drawings. FIG. 1 illustrates a conceptual block diagram for explaining a related art method of compensating for a delay between clock signals, showing, as an example, a case when one clock signal is used.

Referring to FIG. 1, a related art device of compensating for a delay between clock signals is provided with scannable flipflops 11 and 11a, a combination circuit 13, and a delay unit 15. That is, the related art device of compensating for a delay between clock signals is provided with a first scannable flipflop 11 for receiving a data in response to a clock signal CLK, a combination circuit 13 connected to an output terminal on the first scannable flipflop 11, a delay unit 15 for delaying the clock signal for compensating for a delay between clock signals, and a second scannable flipflop 11a for receiving a signal from the combination circuit 13 using a signal from the delay unit 15 as a clock signal. In this instance, the inconsistency of clocks caused by the delay unit 15 causes the improper data transmission. In order to compensate for this, appropriate number of delays are provided between each of the flipflops which has a delay time period shorter than a delay time period by the delay unit 15, additionally.

A related art method of compensating for a delay between clock signals will be explained. FIG. 2 illustrates a flow chart for explaining a related art method of compensating for a delay between clock signals.

Referring to FIG. 2, the related art method of compensating for a delay between clock signals starts with calculating a delay value 'a' between the scannable flipflops (S201). A target value 'b' between flipflops is subtracted from the delay value 'a' between the scannable flipflops, to obtain a resultant 'c'(S202). The resultant 'c' is compared to '0'(S203), to fix a number 'd' of delays in the delay unit if the resultant 'c' is greater than '0'(S204). The number 'd' of delays is fixed with reference to kind of the delay 'e' and a delay time period 'f' per a delay. In other words, when the delay value between the flipflops is smaller than a value delayed by the delay unit, an appropriate number of delays are provided between the flipflops having the smaller delay value. A number 'd' of delays as many as the delays fixed thus is added to a netlist(S205), to provide the delay unit 15 shown in FIG. 1. That is, a delay value 'a' between flipflops are calculated, for providing a delay buffer between all flipflops each of which has a delay value smaller than the target delay value. Thus, the application of a technology to a design of an integrated circuit which employs different clock signals leads to require many delays for scan test, in which technology a delay time period between each of flipflops is calculated, and an appropriate number of delays are added between the flipflops if the calculated delay time period is shorter than a desired value irrespective of the clock signals applied to respective scannable flipflops.

However, the related art method of compensating for a delay between clock signals has the following problems.

First, because no delay between clocks are taken into consideration when multi-clock is used in a normal state, test clock signals may not be uniform due to the delay between clocks during the scan test. The non-uniform test clock signals impede an accurate data transmission.

Second, the greater delay value between clocks when different clock signals are used leads to require more delays for use in the scan test. That is, the provision of many delays leads to have a greater integrated circuit.

SUMMARY OF THE INVENTION

Accordingly, the present invention is directed to a method of compensating for a delay between clock signals that substantially obviates one or more of the problems due to limitations and disadvantages of the related art.

An object of the present invention is to provide a method of compensating for a delay between clock signals, in which a small number of delays are added, for solving a non-uniformity of clock signals.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method of compensating for a delay between clock signals for a semiconductor integrated circuit having a plurality of devices synchronous to a plurality of clock signals includes the steps of (1) searching for devices between which a data transmission path is set up synchronous to different clock signals among the plurality of devices, and (2) adding a plurality of delays only to between the devices having the data transmission path set up therebetween for compensating for the delay coming from a difference of clock signals.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
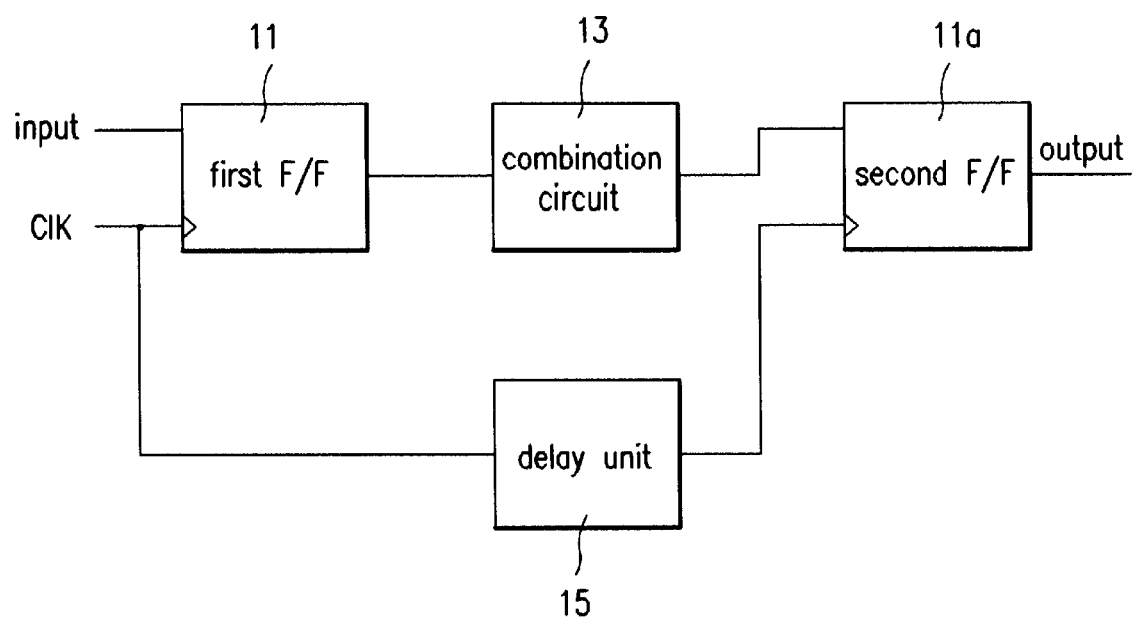
FIG. 1 illustrates a conceptual block diagram for explaining a related art method of compensating for a delay between clock signals.
Figure 2:
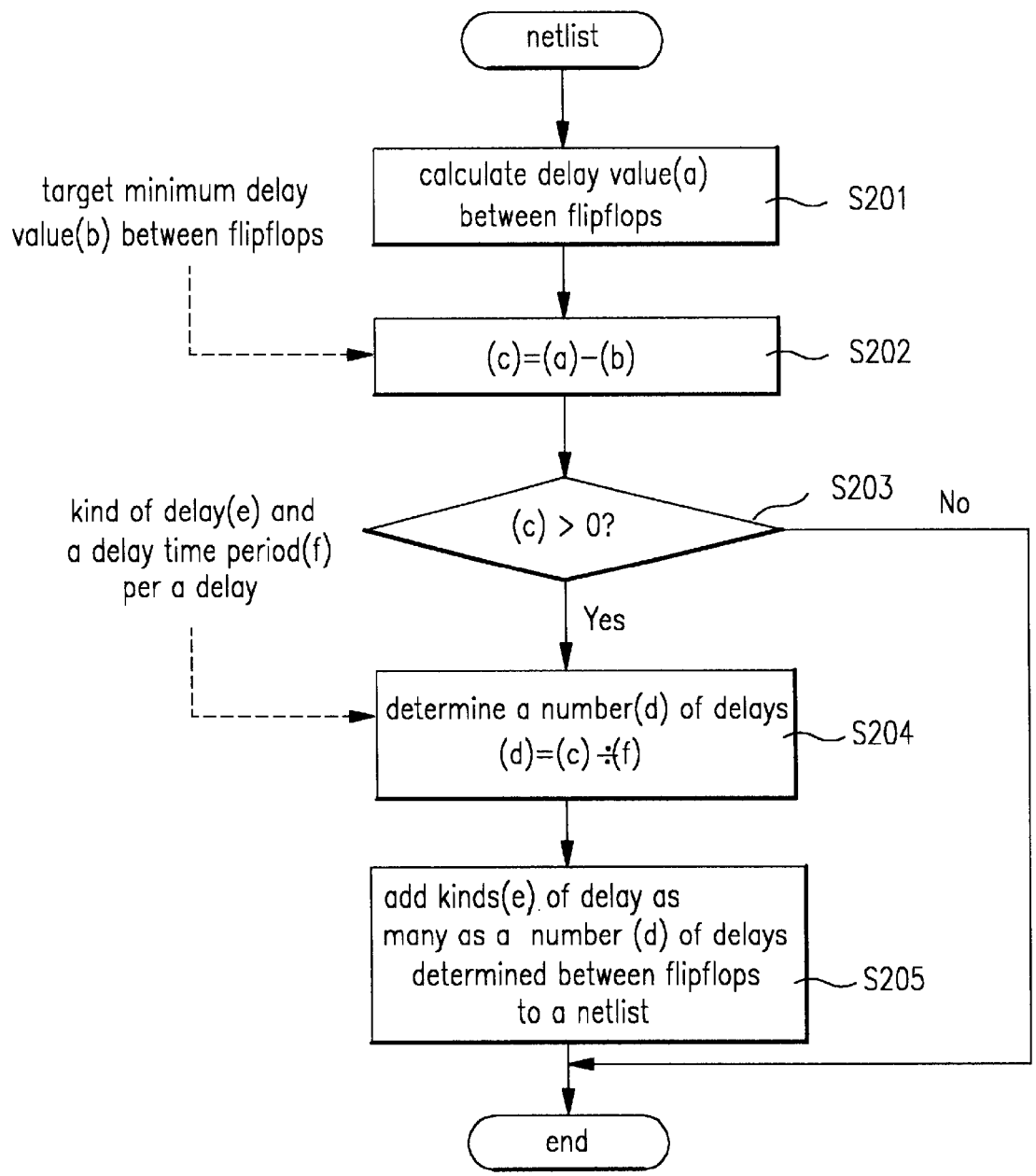
FIG. 2 illustrates a flow chart for explaining a related art method of compensating for a delay between clock signals; and, FIG. 3 illustrates a flow chart for explaining a method of compensating for a delay between clock signals in accordance with a preferred embodiment of the present invention.
Figure 3:
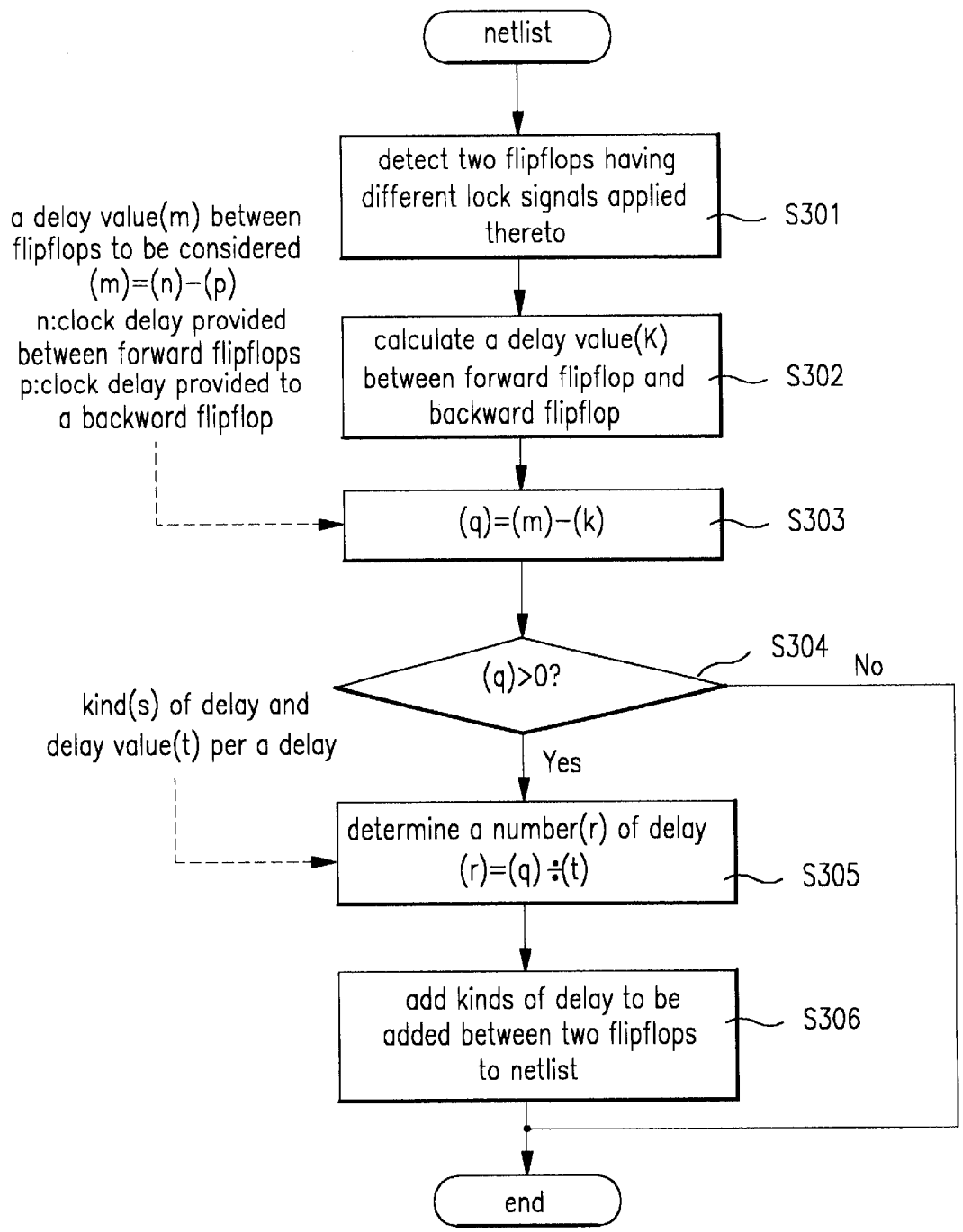

Reference will now be made in detail to the preferred embodiments of the present invention, examples of which are illustrated in the accompanying drawings. The present invention suggests to add delays, not to every flipflop, but only between pairs of flipflops between which a data passes. The addition of delays only to required parts leads to use less number of delays, that permits to minimize a size of the integrated circuit. FIG. 3 illustrates a flow chart for explaining a method of compensating for a delay between clock signals in accordance with a preferred embodiment of the present invention.

Referring to FIG. 3, the method of compensating for a delay between clock signals in accordance with a preferred embodiment of the present invention starts with searching for two scannable flipflops having different clock signals applied thereto(S301). Then, a delay value 'k' between a forward scannable flipflop and a backward scannable flipflop is calculated(S302). The delay value 'k' between the forward scannable flipflop and the backward scannable flipflop is subtracted from a value 'm' obtained by subtracting a delay value 'p' provided to the backward scannable flipflop from a delay value 'n' of a clock signal provided to the forward scannable flipflop, to obtain a resultant 'q'(S303). The resultant 'q' is compared to '0'(S304), to determine a number 'r' of delays if the resultant is greater than '0'(S305). That is, as the resultant 'q' is greater than '0', the number 'r' of delays is adjusted, so that at least the resultant 'q' is not greater than '0'. The number of the delays 'r' is determined with reference to kind 's' and a delay time period 't' per delay. That is, q/t =r. After the number 'r' of delays is determined, kinds 's' of delays to be added between the two flipflops are added to a netlist(S306). Thus, the method of compensating for a delay between clock signals of the present invention sorts out clock signals by sources, and a path through which a data transmission is made by using different clock signals is searched, for adding delays to the path.

As has been explained, the method of compensating for a delay between clock signals has the following advantage.

Because delays are added to only paths through which the data transmissions are made between flipflops sorted out by different clock signals, the problems caused by the non-uniformity of the clock signals cab be solved by using a small number of delays.

It will be apparent to those skilled in the art that various modifications and variations can be made in the method of compensating for a delay between clock signals of the present invention without departing from the spirit or scope of the invention. Thus, it is intended that the present invention cover the modifications and variations of this invention provided they come within the scope of the appended claims and their equivalents.

What is claimed is:

1. A method of compensating for a delay between clock signals, the method comprising the steps of:
    (1) searching for two flipflops having different clock signals applied thereto, respectively;
    (2) calculating the delay between a forward flipflop and a backward flipflop;
    (3) calculating a value obtained by subtracting a delay of the clock signal provided to the backward flipflop from a delay of the clock signal provided to the forward flipflop;
    (4) subtracting the value obtained by subtracting a delay of the clock signal provided to the backward flipflop from a delay of the clock signal provided to the forward flipflop from the delay between the forward flipflop and the backward flipflop, to calculate a resultant;
    (5) determining a number of delays to be added, if the resultant is greater than a desired value; and,
    (6) adding kinds of the delays to be added between the two flipflops to a netlist.

2. A method as claimed in claim 1, wherein a number of the delays is determined based on kinds of delays and a delay time period per a delay.

3. A method as claimed in claim 2, wherein a number of the delays is determined by dividing the resultant by the delay value per a delay.

4. A method as claimed in claim 2, wherein the delay includes a buffer.

5. A method of compensating for a delay between clock signals for semiconductor integrated circuit having a plurality of devices and employing a plurality of clock signals, comprising:
    (1) searching for devices between which a data transmission path is set up synchronous to different clock signals among the devices;
    (2) calculating a first delay between a first device and a second device;
    (3) calculating a second delay according to delays of each clock signal provided to each devices;
    (4) determining the number of delays to be added between the devices according to the first and second delays; and
    (5) adding delays between the first and second devices for compensating the delay coming from a difference of clock signals provided to each device.

6. The method as claimed in claim 5, wherein the second delay is calculated by subtracting a delay of a clock signal provided to the first device from a delay of clock signal provided to the second device.

7. The method as claimed in claim 6, wherein the step (4) includes the steps of:
    (4-1) subtracting the second delay from the first delay; and
    (4-2) determining the number of delays to be added between the first and second devices if a subtracting result is greater than a desired delay.

8. The method as claimed in claim 7, wherein the number of delays are determined based on kinds of delays and a delay value per a delay.

9. The method as claimed in claim 5, wherein the first and second devices are flipflops.

* * * * *